(12) United States Patent
Tanaka

(10) Patent No.: US 7,804,539 B2
(45) Date of Patent: Sep. 28, 2010

(54) SOLID-STATE IMAGING DEVICE AND METHOD OF DRIVING SAME

(75) Inventor: Shunsuke Tanaka, Miyagi (JP)

(73) Assignee: FUJIFILM Corporation, Tokyo (JP)

( * ) Notice: Subject to any disclaimer, the term of this patent is extended or adjusted under 35 U.S.C. 154(b) by 529 days.

(21) Appl. No.: 11/826,484

(22) Filed: Jul. 16, 2007

(65) Prior Publication Data

US 2008/0018768 A1 Jan. 24, 2008

(30) Foreign Application Priority Data

Jul. 20, 2006 (JP) .......................... P2006-198302

(51) Int. Cl.
*H04N 5/335* (2006.01)
*H04N 9/64* (2006.01)

(52) U.S. Cl. ..................... 348/312; 348/249
(58) Field of Classification Search ................. 348/294, 348/311, 312, 315, 316
See application file for complete search history.

(56) References Cited

U.S. PATENT DOCUMENTS

| | | | | |
|---|---|---|---|---|
| 5,393,997 | A * | 2/1995 | Fukusho et al. | 257/232 |
| 6,356,305 | B1 * | 3/2002 | Akagawa | 348/311 |
| 6,707,494 | B1 * | 3/2004 | Misawa et al. | 348/273 |
| 6,760,072 | B1 * | 7/2004 | Furumiya | 348/312 |
| 7,034,876 | B2 * | 4/2006 | Harada | 348/319 |
| 7,038,723 | B1 * | 5/2006 | Kuroda et al. | 348/312 |
| 7,336,305 | B2 * | 2/2008 | Suzuki | 348/249 |
| 7,589,773 | B2 * | 9/2009 | Ide et al. | 348/294 |
| 2006/0274178 | A1 * | 12/2006 | Inoue et al. | 348/311 |

FOREIGN PATENT DOCUMENTS

| | | | |
|---|---|---|---|
| JP | 07322143 | * | 8/1995 |
| JP | 7-322143 A | | 12/1995 |
| JP | 2001-16510 A | | 1/2001 |

* cited by examiner

*Primary Examiner*—Lin Ye
*Assistant Examiner*—Trung Diep
(74) *Attorney, Agent, or Firm*—Birch, Stewart, Kolasch & Birch, LLP

(57) ABSTRACT

A method of driving a solid-state imaging device is provided. The solid-state imaging device includes: a semiconductor substrate; a plurality of photoelectric converting elements arranged in a two-dimensional array on a light-receiving surface of the semiconductor substrate; and a charge transfer path disposed along each of columns of photoelectric converting elements, the charge transfer path reading out charges detected at each of photoelectric converting elements in a column of the photoelectric converting elements and transferring the charges, the photoelectric converting elements in the column thereof comprising two groups, each containing every other photoelectric converting element. Charges are read out from the two groups into the charge transfer path at a time difference between the two groups.

5 Claims, 7 Drawing Sheets

FIRST LINE

SOLID-STATE IMAGING DEVICE AND METHOD OF DRIVING SAME

BACKGROUND OF THE INVENTION

1. Field of the Invention

The present invention relates to a CCD (Charge Coupled Device) solid-state imaging device, and more particularly to a solid-state imaging device in which full pixel reading is performed by progressive scanning, and a method of driving the device.

2. Description of Related Art

In the case where signal charges are read out from pixels (photoelectric converting elements) of a CCD solid-state imaging device, as described in, for example, JP-A-7-322143 (Japanese Patent No. 3,509,184) and JP-A-2001-16510, a read-out pulse is applied to a read-out electrode, and at the same time a pulse of a polarity opposite to the read-out pulse is applied to an adjacent electrode and the like, thereby suppressing a rise of the depletion voltage. This will be described with reference to FIGS. 5 to 8.

FIG. 5 is a diagram of a solid-state imaging device of the pixel interpolation type. Plural photodiodes (photoelectric converting elements) 1 are arranged in a checkered pattern on the surface of a semiconductor substrate. The characters R (red), G (green), and B (blue) shown on the photodiodes 1 indicate the colors of color filters stacked on the photodiodes. Photodiode rows on which color filters of G are stacked, and those on which color filters of R and B are alternately stacked are arranged alternately while being shifted by ½ pitch.

The solid-state imaging device is of the pixel interpolation type, and configured so that the interpolation calculation is applied to signals detected by the photodiodes (actual pixels) which are arranged in a checkered pattern, thereby obtaining signals of imaginary pixels at the other checkered positions.

A vertical charge transfer path (VCCD) 2 which meanders so as to avoid photodiodes is disposed on the right next to each photodiode column. A horizontal charge transfer path (HCCD) 3 which communicates with end portions of the vertical charge transfer paths 2 is disposed of a lower edge portion of the semiconductor substrate. An output amplifier 4 is disposed in an output stage of the horizontal charge transfer path 3.

Each of the vertical charge transfer paths 2 is configured by an embedded channel disposed in the semiconductor substrate, and transfer electrode films 2a which are disposed on the channel via a gate insulating film. In the illustrated solid-state imaging device, four vertical transfer electrode films 2a are disposed for each photodiode. The vertical transfer electrode films 2a at the same vertical position of each vertical charge transfer path 2 are electrically connected to one another in the horizontal direction, formed while meandering so as to avoid the photodiodes 1, and subjected to an application of the same pulse. Pulses $\phi V1$, $\phi V2$, $\phi V3$, $\phi V4$ are applied to the four vertical transfer electrode films 2a, respectively.

FIG. 6 is a waveform chart of the pulses $\phi V1$, $\phi V2$, $\phi V3$, $\phi V4$ for reading out signal charges from the photodiodes by progressive scanning, and transferring them in the vertical direction. In the figure, VH=+15 V, VM=0 V, and VL=−8 V.

FIGS. 7 and 8 are potential transition diagrams of vertical charge transfer paths of first and second lines which are driven by the pulses $\phi V1$ to $\phi V4$. At time t3, $\phi V1$ is set to the VH level (read-out pulse), and a deep potential well is formed (the black arrow a in FIG. 7) under the transfer electrode film in the obliquely right downward direction of the photodiode G (the photodiode 1 on which the color filter of G is stacked) shown in FIG. 5. The signal charge of the photodiode G is read out into the potential well. At this time, the potential of $\phi V3$ is set to the opposite polarity, i.e., the VL level, so that the potential at the position of the electrode film is raised as indicated by the black arrows b in FIG. 7, whereby the depletion voltage is prevented from rising.

Thereafter, times t4, t5, t6, t7 elapse. In accordance with the elapse, the potentials of the pulses $\phi V1$ to $\phi V4$ are changed as shown in FIG. 6. Then, the signal charge of the photodiode G is vertically transferred by a distance which exactly corresponds to two vertical transfer electrode films 2a.

When $\phi V3$ is set to the VH level (read-out pulse) at time t7, deep potential wells are formed (the black arrow c in FIG. 8) under the transfer electrode films in the obliquely right downward direction of the photodiodes R, B shown in FIG. 5. The signal charges of the photodiodes R, B are read out into the potential wells. At this time, $\phi V1$ is at the VL level. When the potential of $\phi V2$ is set to the opposite polarity, i.e., the VL level, therefore, the potentials at the positions of the electrode films to which the potential $\phi V2$ is applied are raised as indicated by the black arrow d in FIG. 8, whereby the depletion voltage is prevented from rising.

In the state of time t7, the transfer position of the signal charge of the photodiode G, and the transfer positions of the signal charges of the photodiodes R, B are aligned with one another at the same vertical position. Thereafter, the transferring operation in the vertical transferring direction is performed.

At time t7 of FIG. 8, the vertical transfer electrode film to which $\phi V3$ that is the VH level is applied, and that to which $\phi V2$ that is the VL level is applied are at positions adjacent to each other. Therefore, the potential difference of the electrodes is as large as VH−VL=23 V.

In recent solid-state imaging devices, in order to mount several million or more pixels, miniaturization is advancing, and the thickness of a gate insulating film is thinning. Therefore, a large potential difference between adjacent electrode films causes various issues of reliability. For example, leakage vertical lines due to local destruction of a gate insulating film appear in a photographed image, and that, during electric field concentration caused by a large potential difference, the interface level due to impact ions is varied, and dark properties are impaired.

SUMMARY OF THE INVENTION

An object of an illustrative, non-limiting embodiment of the invention is to provide a full-pixel reading solid-state imaging device in which reduction of the reliability due to electric field concentration during application of a read-out pulse is avoided without being accompanied by a rise of a depletion voltage, and a method of driving the device.

According to an aspect of the invention, there is provided a solid-imaging device or a method of driving the same. The solid-imaging device includes: a semiconductor substrate; a plurality of photoelectric converting elements arranged in a two-dimensional array on a light-receiving surface of the semiconductor substrate; and a charge transfer path disposed along each of columns of photoelectric converting elements, the charge transfer path reading out charges detected at each of photoelectric converting elements in a column of the photoelectric converting elements and transferring the charges, the photoelectric converting elements in the column thereof comprising two groups, each containing every other photoelectric converting element. Charges are read out from the two groups into the charge transfer path at a time difference between the two groups.

In an aspect of the invention, a read-out pulse is applied to a charge transfer electrode of the charge transfer path to read out a charge from a photoelectric converting element into the charge transfer path, and when the charges are read out from any one of the two groups, a pulse of a polarity opposite to the read-out pulse is applied to a charge transfer electrode located at a position which is separated from a charge transfer electrode to which the read-out pulse is applied.

In an aspect of the invention, when the charges are read out from any one of the two groups, a potential between a potential of the read-out pulse and a potential of the pulse of the polarity opposite to the read-out pulse is applied to a charge transfer electrode adjacent to the charge transfer electrode to which the read-out pulse is applied.

BRIEF DESCRIPTION OF THE DRAWINGS

The features of the invention will appear more fully upon consideration of the exemplary embodiments of the inventions, which are schematically set forth in the drawings, in which.

DETAILED DESCRIPTION OF THE EXEMPLARY EMBODIMENTS

Although the invention will be described below with reference to the exemplary embodiment thereof, the following exemplary embodiment and its modification do not restrict the invention.

According to an exemplary embodiment of the invention, a rise of a depletion voltage can be avoided in full pixel reading, and also reduction of the reliability due to electric field concentration during application of a read-out pulse can be avoided.

Hereinafter, an exemplary embodiment of the invention will be described with reference to the accompanying drawings.

Figure 1:
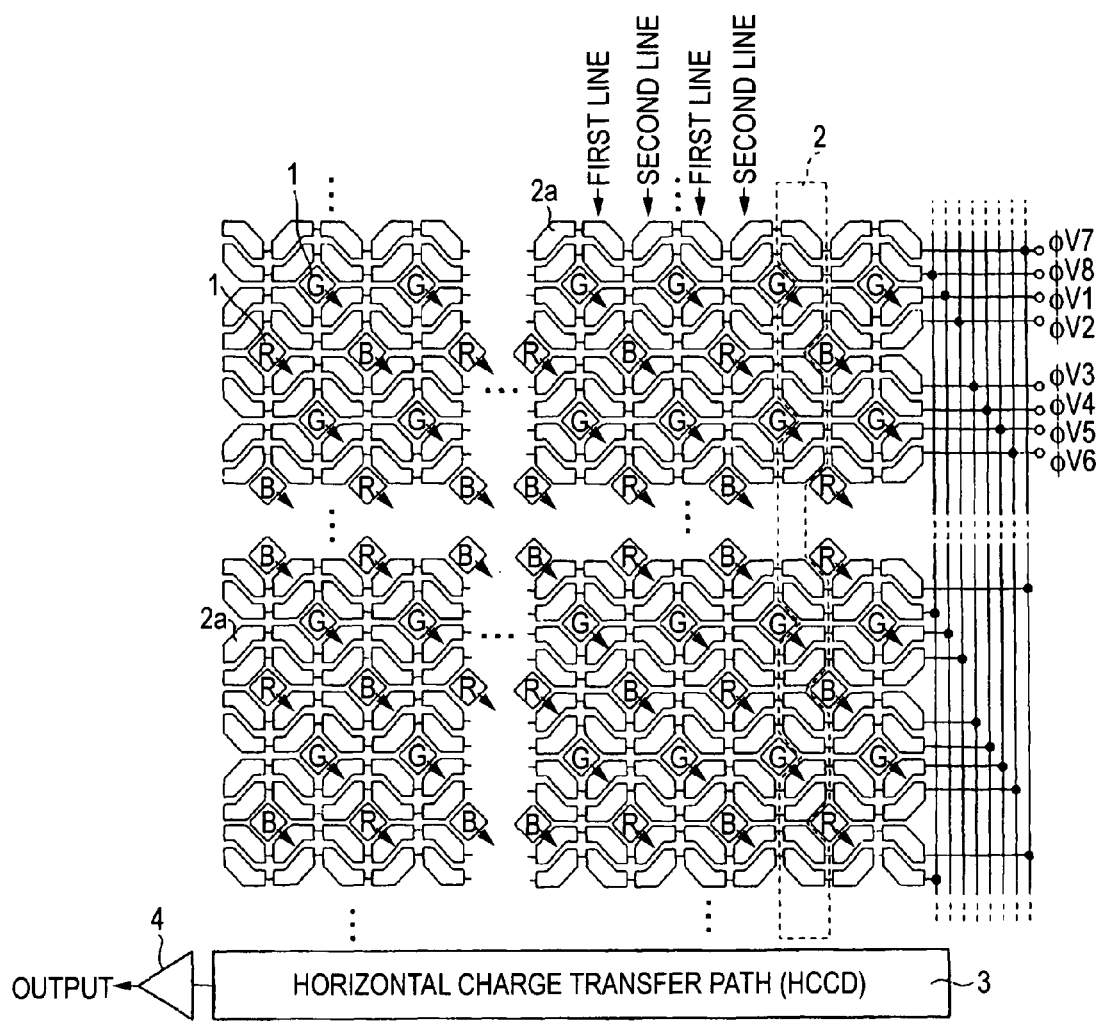
FIG. 1 is a diagram of a CCD solid-state imaging device of an exemplary embodiment of the invention.

FIG. 1 is a diagram of a CCD solid-state imaging device of an exemplary embodiment of the invention. The basic configuration of the solid-state imaging device is identical with that of the solid-state imaging device which has been described with reference to FIG. 5, and includes the photodiodes 1, the vertical charge transfer paths 2, the horizontal charge transfer path 3, and the output amplifier 4.

Figure 5:
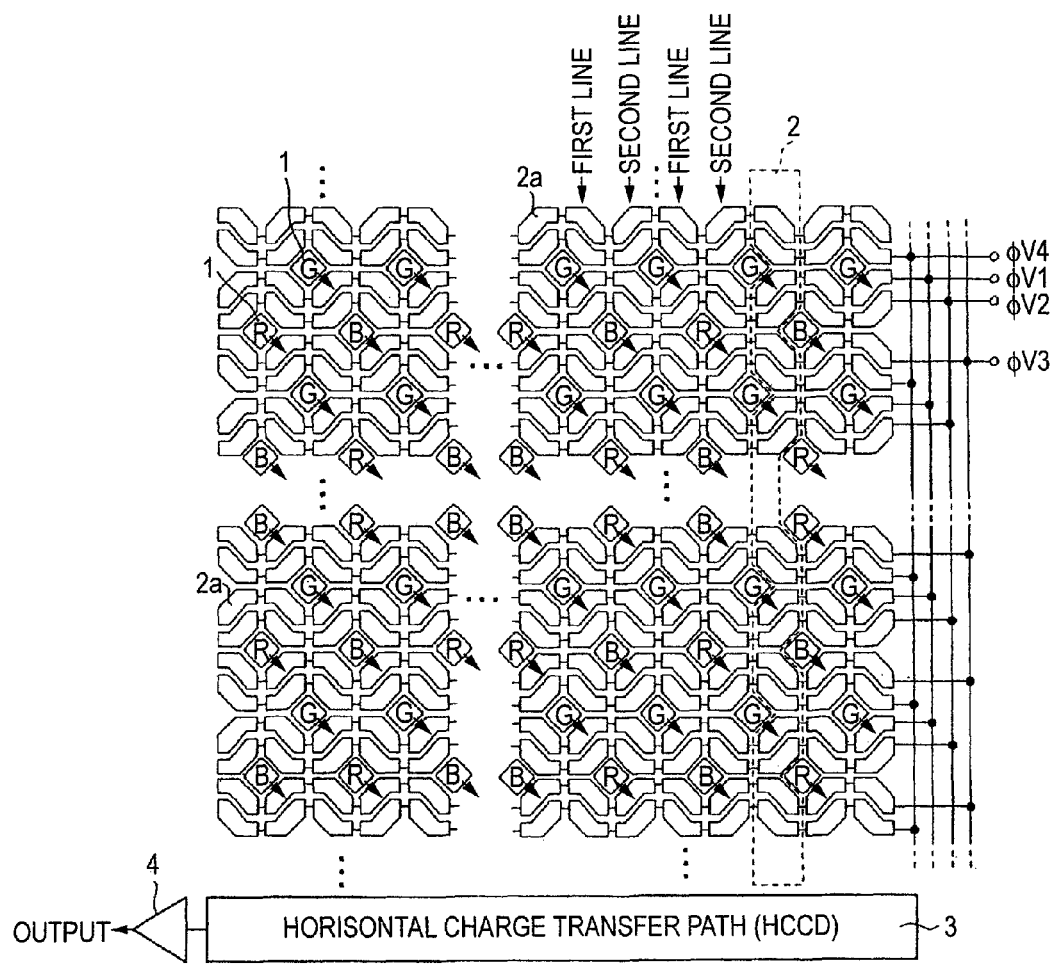
FIG. 5 is a diagram of an example of a CCD solid-state imaging device in the related art.
Figure 6:
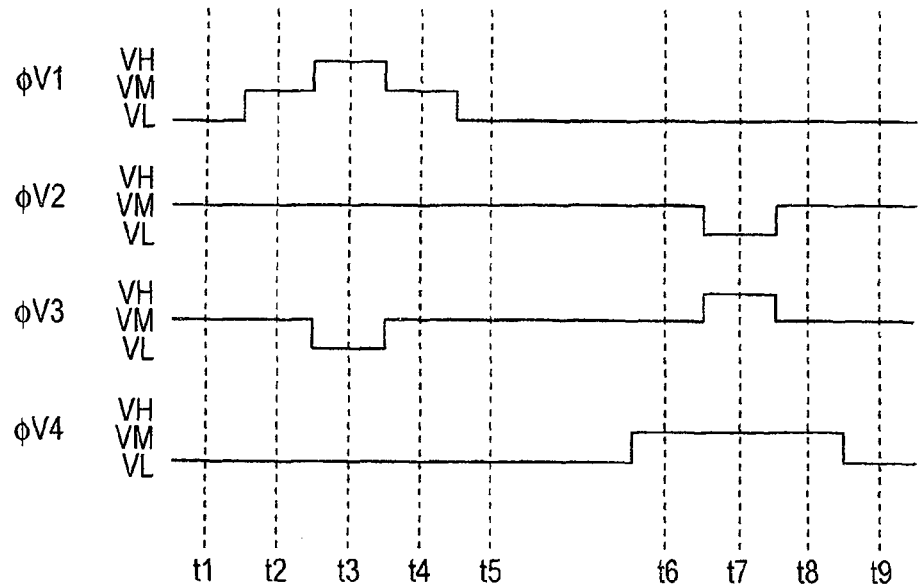
FIG. 6 is a waveform chart of pulses for driving the CCD solid-state imaging device shown in FIG. 5.
Figure 7:
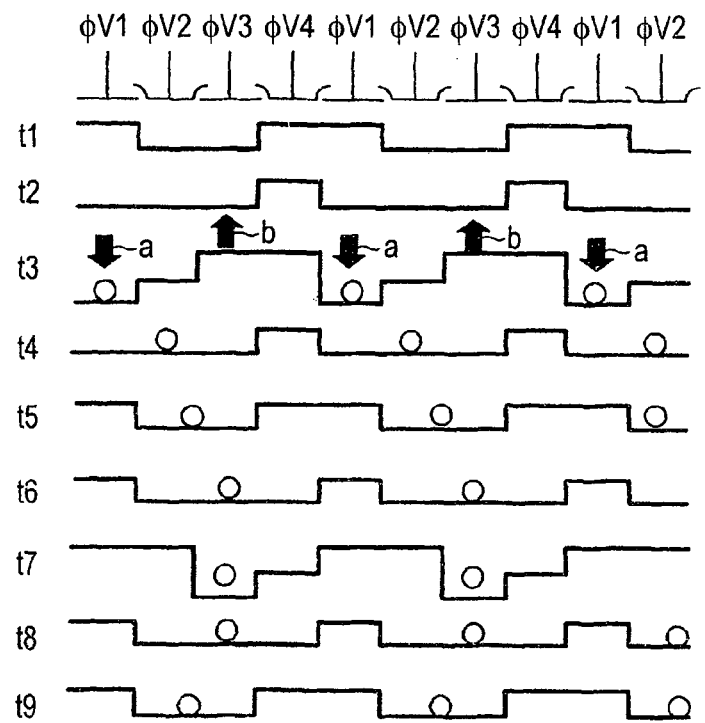
FIG. 7 is a potential transition diagram of a vertical charge transfer path of a first line which is driven by the pulses shown in FIG. 5.
Figure 8:
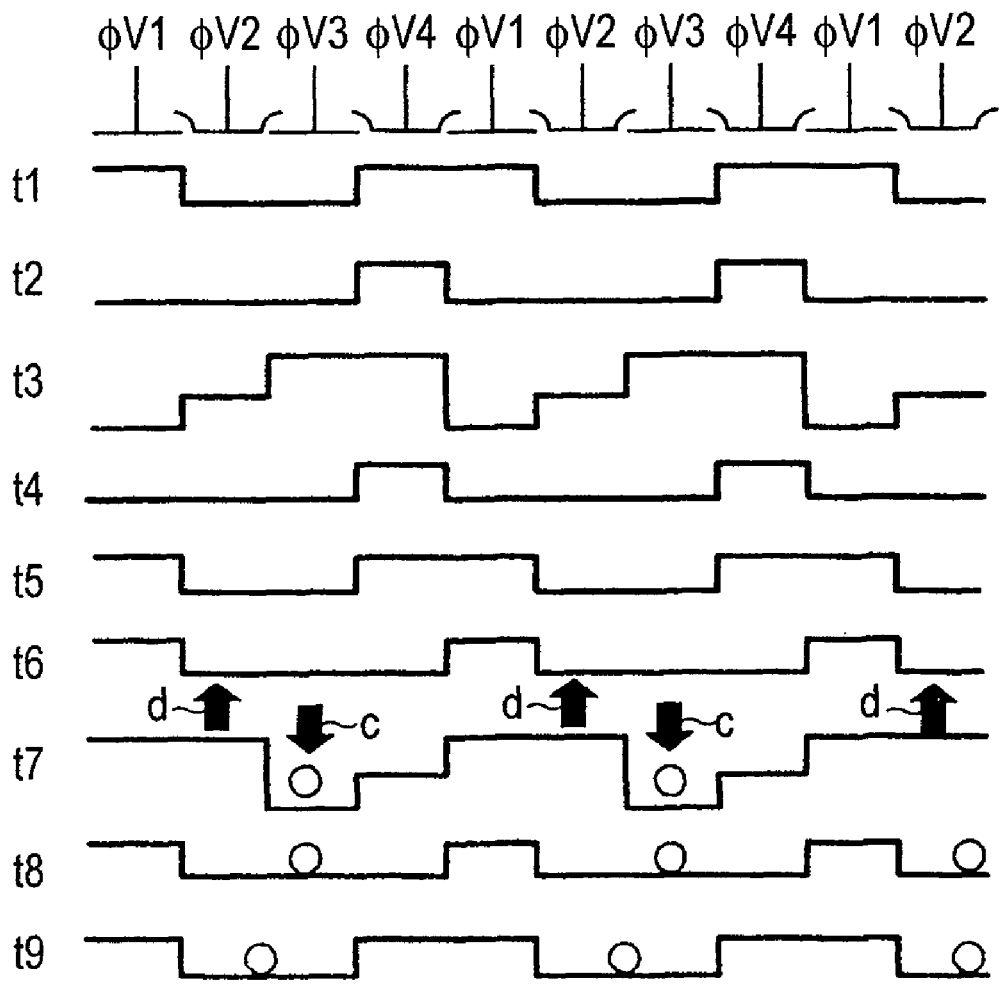
FIG. 8 is a potential transition diagram of a vertical charge transfer path of a second line which is driven by the pulses shown in FIG. 5.

The solid-state imaging device of the embodiment is different from that shown in FIG. 5 in a wiring connection between the vertical transfer electrode films 2a and a drive pulse outputting portion which is not shown, and the kinds of drive pulses.

As described with reference of FIG. 5, four transfer electrode films 2a are disposed for each photodiode, and conventionally the pulses φV1, φV2, φV3, φV4 are applied to the four films, respectively.

By contrast, the embodiment has a connecting configuration in which pulses φV1, φV2, φV3, φV4, φV5, φV6, φV7, φV8 are applied to four transfer electrode films 2a that are disposed for one photodiode, and four transfer electrode films 2a that are disposed for a photodiode that is vertically adjacent to the one photodiode, or eight transfer electrode films 2a in total, respectively. Namely, the embodiment has a wiring connection for performing an eight-phase drive.

In the example shown in FIG. 1, the pulse φV1 is applied to a row of transfer electrode films 2a which are arranged under a certain row of photodiodes G, the pulse φV2 is applied to a row of transfer electrode films 2a which are arranged above the next row of photodiodes R, B, the pulse φV3 is applied to a row of transfer electrode films 2a which are arranged below the row of the photodiodes R, B, . . . , the pulse φV8 is applied to a row of transfer electrode films 2a which are arranged above a row of photodiodes G. Namely, the example has a connecting configuration in which the pulses φV1 to φV8 are repeatedly applied to every eight rows of transfer electrode films 2a.

Figure 2:
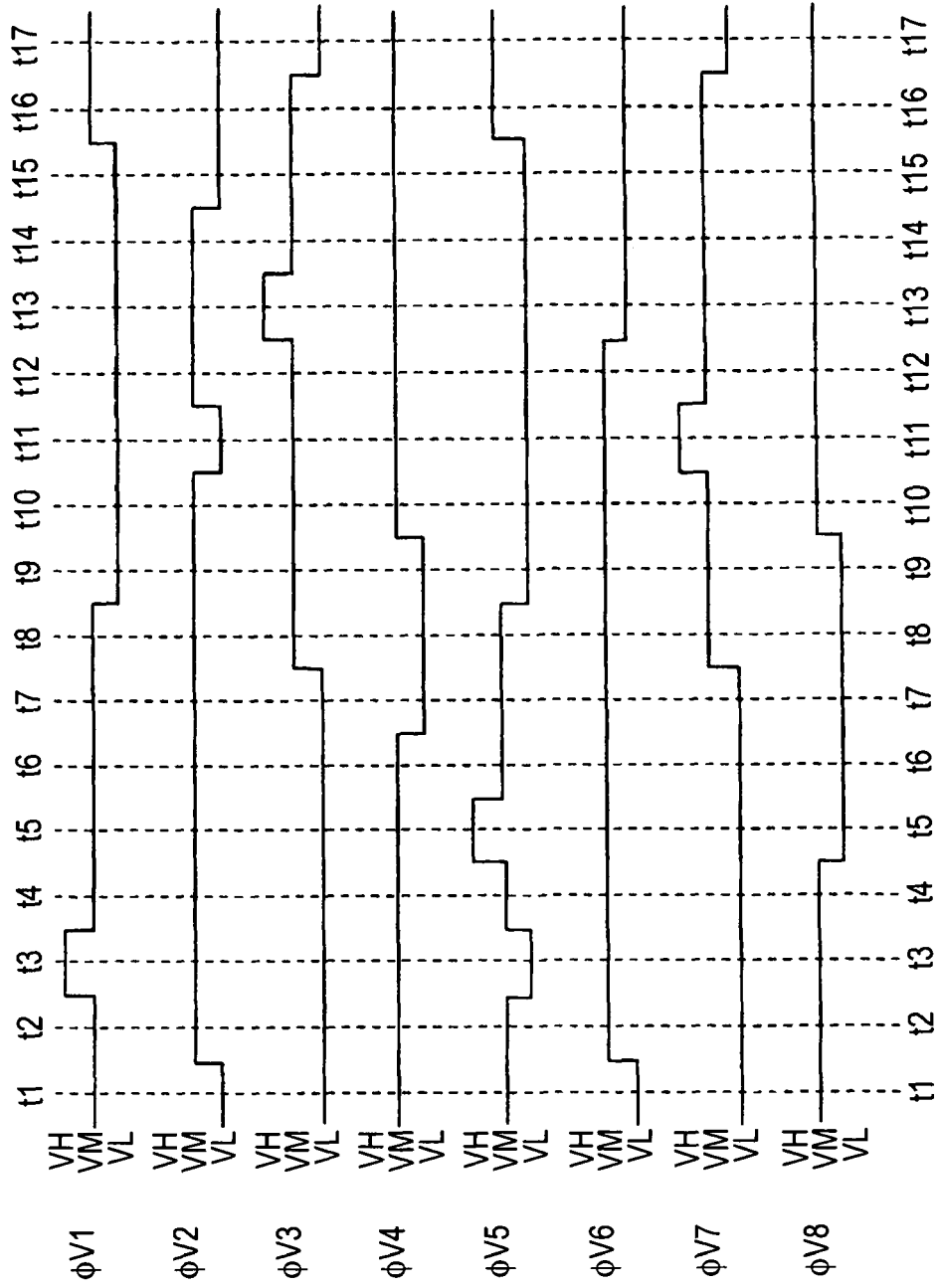
FIG. 2 is a waveform chart of pulses for driving the CCD solid-state imaging device shown in FIG. 1.

FIG. 2 is a waveform chart of the pulses φV1 to φV8. In the figure, VH=+15 V, VM=0 V, and VL=−8 V. At time ti, "φV1, φV2, φV3, φV4, φV5, φV6, φV7, φV8" are set as follows:

time t1: VM, VL, VL, VM, VM, VL, VL, VM
time t2: VM, VM, VL, VM, VM, VM, VL, VM
time t3: VH, VM, VL, VM. VL, VM, VL, VM
time t4: VM, VM, VL, VM, VM, VM, VL, VM
time t5: VM, VM, VL, VM, VH, VM, VL, VL
time t6: VM, VM, VL, VM, VM, VM, VL, VL

. . .

time t10: VL, VM, VM, VM, VL, VM, VM, VM
time t11: VL, VL, VM, VM, VL, VM, VH, VM
time t12: VL, VM, VM, VM, VL, VM, VM, VM
time t13: VL, VM, VH, VM, VL, VL, VM, VM
time t14: VL, VM, VM, VM, VL, VL, VM, VM

. . .

Figure 3:
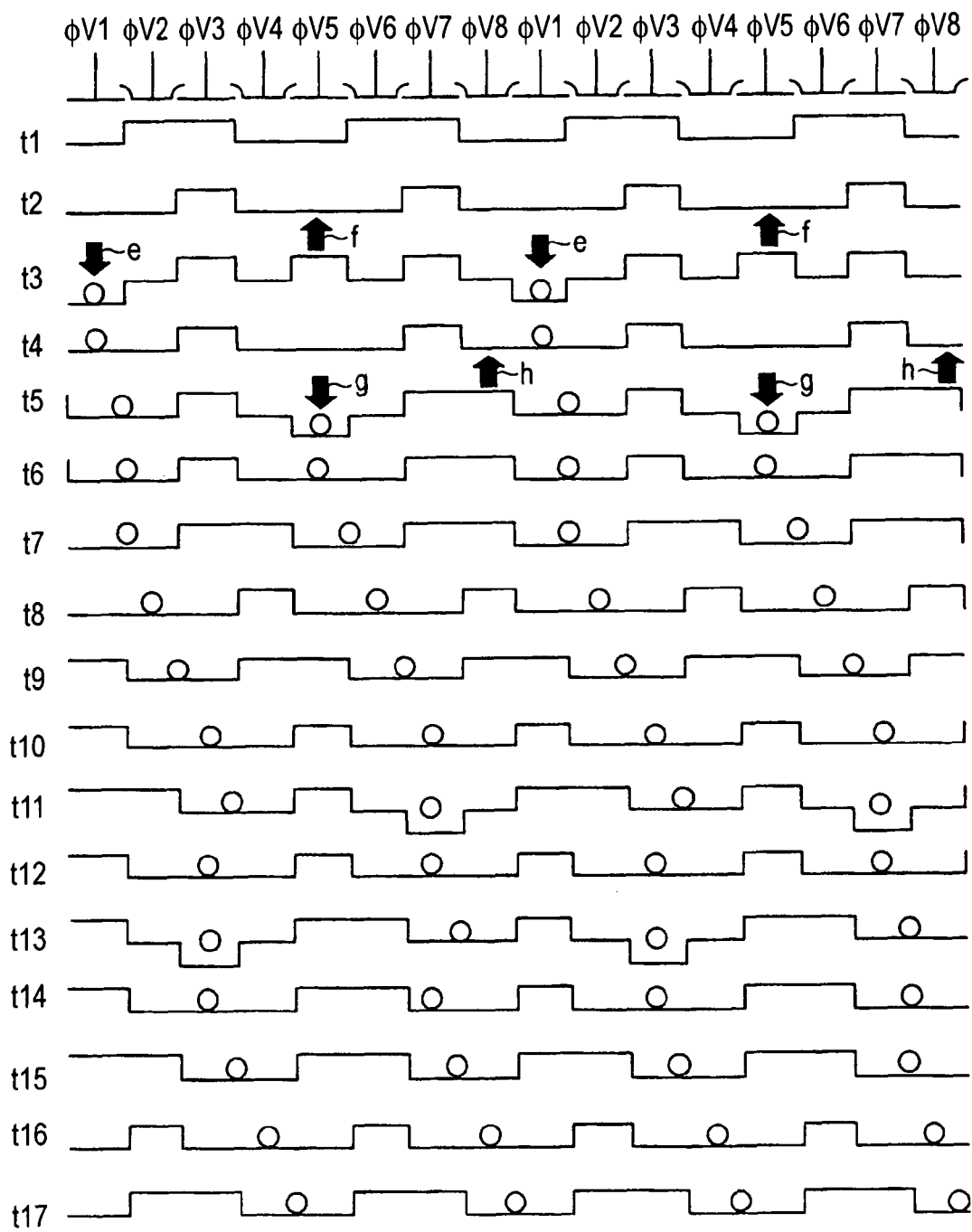
FIG. 3 is a potential transition diagram of a vertical charge transfer path of a first line which is driven by the pulses shown in FIG. 2.
Figure 4:
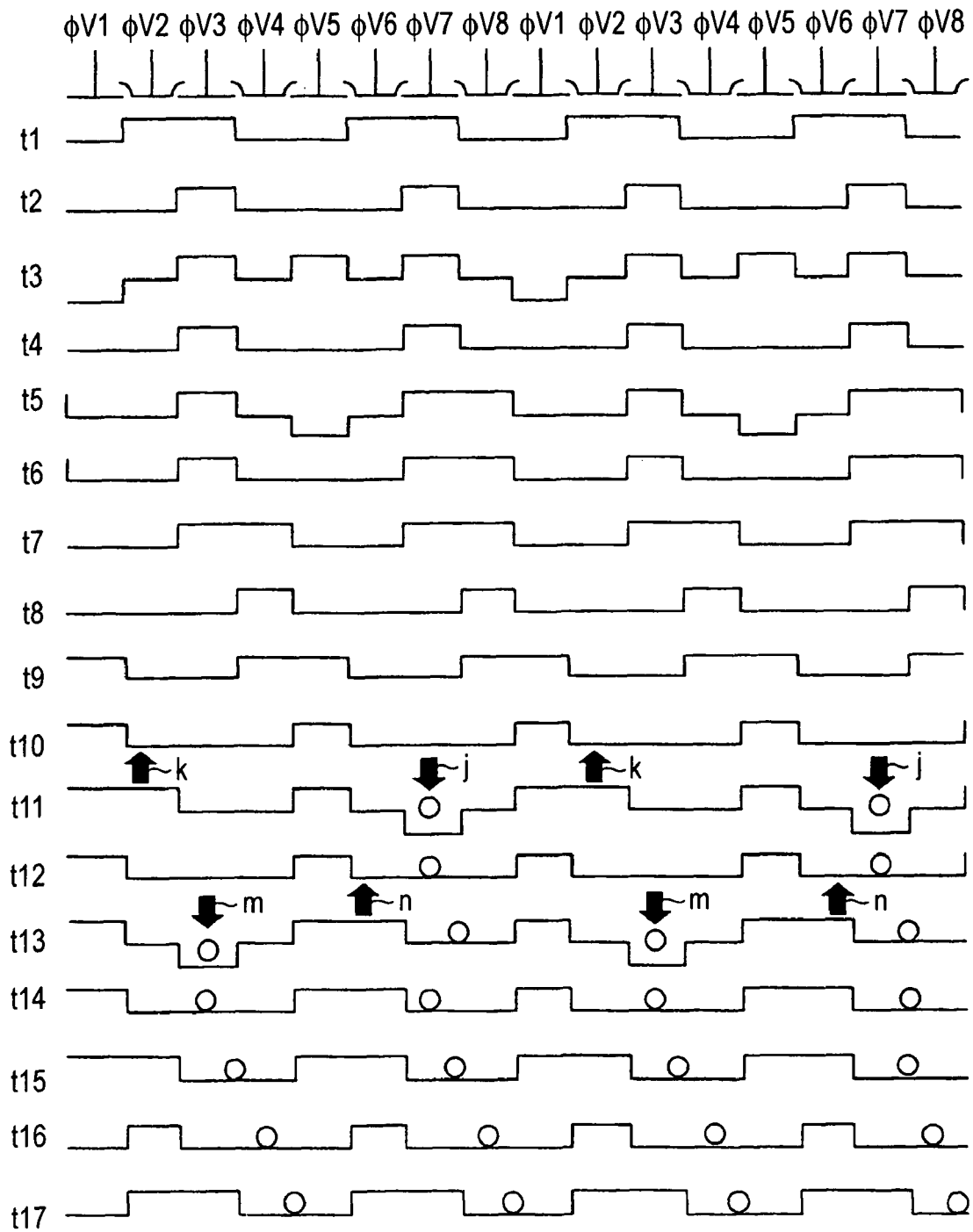
FIG. 4 is a potential transition diagram of a vertical charge transfer path of a second line which is driven by the pulses shown in FIG. 2.

FIG. 3 is a potential transition diagram of a vertical charge transfer path (vertical charge transfer path of the column of the photodiodes G) of the first line in the case where the vertical charge transfer path is driven by the pulses φV1 to φV8. FIG. 4 is a potential transition diagram of a vertical charge transfer path (vertical charge transfer path of the column of the photodiodes R, B) of the second line.

At time t3, φV1 is set to the VH level (read-out pulse), and potential wells at the positions of the transfer electrode films 2a which are in the obliquely right downward direction of every other photodiode G along the first line become deep as indicated by the black arrows e, and signal charges are moved from the photodiodes G into the potential wells. At the same time, the level of a voltage that is applied to the electrodes adjacent to the electrodes to which the read-out pulse is applied is set to VM (φV2, φV8). Therefore, electric field concentration during the application of the read-out pulse is mitigated.

Furthermore, at the same time (time t3), φV5 is set to the VL level, and hence the potentials of the electrodes (the read-out electrodes of the photodiode G from which the signal charge is not read out) that are remotest from the electrodes to which φV1 is applied are raised as indicated by the black arrows f, and a rise of the depletion voltage is suppressed.

At next time t4, the potential wells in which the signal charges are stored are shallow and extend over an area corresponding to three electrodes. When φV5 is set to the VH level (read-out pulse) at next time t5, potential wells at the positions of the electrode films 2a in the obliquely right downward direction of the photodiodes G from which signal charges are not read out to the first line become deep as indicated by the black arrows g, and signal charges from the photodiodes G are read out into the potential wells.

At the same time, the level of a voltage applied to the electrodes adjacent to the electrodes to which the read-out pulse is applied is set to VM (φV4, φV6). Therefore, electric field concentration during the application of the read-out pulse is mitigated.

Furthermore, at the same time (time t5), φV8 of the VL level is applied to the electrodes that are remotest from the electrodes to which the VH level is applied, and hence the potentials of the electrodes are raised as indicated by the black arrows h. Therefore, a rise of the depletion voltage is suppressed.

Thereafter, as the time progresses in the sequence of times t6, t7, t8, t9, and t10, each of the potential wells in the first line which store signal charges moves in the vertical direction while repeating expansion and contraction of the three-electrode width→the two-electrode width→the three-electrode width→ . . . .

At time t11, the signal charges (signal charges of G) on the first line are transferred to the reading positions for the photodiodes along the second line. At this time, φV7 is set to the VH level (read-out pulse). Therefore, potential wells at the positions of transfer electrode films which are in the obliquely right downward direction of every other photodiodes R, B along the second line become deep as indicated by the black arrows j of FIG. 4, and signal charges are moved from the photodiodes R, B into the potential wells.

At the same time, the level of a voltage that is applied to the electrodes adjacent to the electrodes to which the read-out pulse is applied is set to VM (φV6, φV8). Therefore, electric field concentration during the application of the read-out pulse is mitigated.

Furthermore, at this time t11, φV2 of the VL level is applied to the electrodes that are remotest from the electrodes to which the VH level is applied. The potentials of the electrodes are raised as indicated by the black arrows k of FIG. 4, and a rise of the depletion voltage is suppressed.

At next time t12, the potential wells which are on the second line, and in which the signal charges are stored are shallow and extend over an area corresponding to three electrodes. When φV3 is set to the VH level (read-out pulse) at next time t13, potential wells at the positions of the electrode films 2a in the obliquely right downward direction of the photodiodes R, B from which signal charges are not read out become deep as indicated by the black arrows m of FIG. 4, and signal charges are read out from the photodiodes R, B into the potential wells.

At the same time, the level of a voltage applied to the electrodes adjacent to the electrodes to which the read-out pulse is applied is set to VM (φV2, φV4). Therefore, electric field concentration during the application of the read-out pulse is mitigated.

Furthermore, at the same time, φV6 of the VL level is applied to the electrodes that are remotest from the electrodes to which the VH level is applied, and hence the potentials of the electrodes are raised as indicated by the black arrows n. Therefore, a rise of the depletion voltage is suppressed.

Thereafter, transfer pulses (binary-level pulses of VM and VL onto which the VH level is not superimposed) are applied to the vertical charge transfer paths as φV1 to φV8, whereby signal charges on the vertical charge transfer paths are transferred to the horizontal charge transfer path.

As described above, in the solid-state imaging device of the embodiment, when signal charges are to be progressively read out, signal charges are not simultaneously read out from all photodiodes along the same charge transfer path, but the photodiodes are divided into the two groups, or the one group consisting of every other photodiode and the other group consisting of the remaining every other photodiode, and signal charges for the respective groups are read out while producing a time difference.

When the read-out pulse is to be applied, therefore, the pulse of the opposite polarity (VL) can be applied to an electrode that is not adjacent to or remote from an electrode to which the read-out pulse (VH) is applied, and a rise of the depletion voltage is suppressed.

Furthermore, the device is configured so that, when the read-out pulse (VH) is to be applied, the potential of the VM level is applied to an electrode adjacent to the electrode to which the read-out pulse is applied. Therefore, electric field concentration is mitigated, and occurrence of a failure due to electric field concentration is avoided.

The embodiment has been described with taking the solid-state imaging device of the pixel interpolation arrangement as an example. Also a CCD solid-state imaging device of the interline transfer or frame interline transfer system can be driven in the same manner. In the embodiment, the eight-phase drive has been exemplarily described. However, the embodiment can be applied to a five or more-phase drive. Furthermore, the embodiment can be applied also to the case where the vertical decimation drive is performed, or where another driving method is implemented.

In the CCD solid-state imaging device of the invention, progressive reading is enabled, and a rise of the depletion voltage is suppressed. Therefore, the invention is useful in an application such as a digital camera on which a solid-state imaging device to be miniaturized is mounted.

While the invention has been described with reference to the exemplary embodiments, the technical scope of the invention is not restricted to the description of the exemplary embodiments. It is apparent to the skilled in the art that various changes or improvements can be made. It is apparent from the description of claims that the changed or improved configurations can also be included in the technical scope of the invention.

This application claims foreign priority from Japanese Patent Application No. 2006-198302, filed Jul. 20, 2006, the entire disclosure of which is herein incorporated by reference.

What is claimed is:

1. A method of driving a solid-state imaging device comprising:
   a semiconductor substrate;
   a plurality of photoelectric converting elements arranged in a two-dimensional array on a light-receiving surface of the semiconductor substrate; and
   a charge transfer path disposed along each of columns of photoelectric converting elements, the charge transfer path reading out charges detected at each of photoelectric converting elements in a column of the photoelectric converting elements and transferring the charges, the photoelectric converting elements in the column thereof comprising two groups, each containing every other photoelectric converting element, the method comprising reading out charges from the two groups into the charge transfer path at a time difference between the two groups wherein a read-out pulse is applied to a charge transfer electrode of the charge transfer path to read out a charge from a photoelectric converting element into the charge transfer path, and wherein when the charges are read out from any one of the two groups, a potential between a potential of the read-out pulse and a potential of the pulse of the polarity opposite to the read-out pulse is applied to charge transfer electrodes both adjacent to the charge transfer electrode to which the read-out pulse is applied.

2. The method according to claim 1, wherein when the charges are read out from any one of the two groups, a pulse of a polarity opposite to the read-out pulse is applied to a charge transfer electrode located at a position which is separated from a charge transfer electrode to which the read-out pulse is applied.

3. A solid-state imaging device comprising:

a semiconductor substrate;

a plurality of photoelectric converting elements arranged in a two-dimensional array on a light-receiving surface of the semiconductor substrate; and a charge transfer path disposed along each of columns of photoelectric converting elements, the charge transfer path reading out charges detected at each of photoelectric converting elements in a column of the photoelectric converting elements and transferring the charges, wherein the photoelectric converting elements in the column thereof comprises two groups, each containing every other photoelectric converting element; and the solid-state imaging device further comprises a drive pulse-applying section that applies driving pulses to read out charges from the two groups into the charge transfer path at a time difference between the two groups, wherein the charge transfer path comprises charge transfer electrodes to which a read-out pulse is applied to read out a charge from a photoelectric converting element, and when the charges are read out from any one of the two groups, the drive pulse-applying section applies a potential between a potential of the read-out pulse and a potential of the pulse of the polarity opposite to the read-out pulse, to a charge transfer electrode adjacent to the charge transfer electrode to which the read-out pulse is applied.

4. The solid-state imaging device according to claim 3, wherein when the charges are read out from any one of the two groups, the drive pulse-applying section applies a pulse of a polarity opposite to the read-out pulse to a charge transfer electrode located at a position which is separated from a charge transfer electrode to which the read-out pulse is applied.

5. A digital camera comprising a solid-state imaging device according to claim 3.

* * * * *